US009330831B2

(12) United States Patent
Lee

(10) Patent No.: US 9,330,831 B2
(45) Date of Patent: May 3, 2016

(54) COMMON MODE FILTER AND POWER SUPPLY DEVICE HAVING THE SAME

(71) Applicant: LG INNOTEK CO., LTD., Seoul (KR)

(72) Inventor: Yong Hee Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 169 days.

(21) Appl. No.: 14/059,510

(22) Filed: Oct. 22, 2013

(65) Prior Publication Data
US 2014/0112042 A1    Apr. 24, 2014

(30) Foreign Application Priority Data

Oct. 22, 2012    (KR) .................. 10-2012-0117328

(51) Int. Cl.
| H02M 1/12 | (2006.01) |
| H01F 27/29 | (2006.01) |
| H01F 17/04 | (2006.01) |
| H03H 7/42 | (2006.01) |
| H01F 17/00 | (2006.01) |
| H03H 1/00 | (2006.01) |

(52) U.S. Cl.
CPC .............. *H01F 27/29* (2013.01); *H01F 17/045* (2013.01); *H03H 7/427* (2013.01); *H01F 2017/0093* (2013.01); *H03H 2001/0057* (2013.01)

(58) Field of Classification Search
CPC ........... H02M 1/12; H02M 1/14; H02M 1/15; Y02B 70/126
USPC .......................................... 363/39, 40, 44–47
See application file for complete search history.

(56) References Cited

U.S. PATENT DOCUMENTS

| 3,305,729 | A | * | 2/1967 | Stein ................ G11C 11/06014 327/354 |
| 4,888,675 | A | * | 12/1989 | Kumar et al. .................... 363/47 |
| 5,077,543 | A | * | 12/1991 | Carlile .......................... 333/177 |
| 5,642,019 | A | * | 6/1997 | Sun ............................. 315/244 |
| 5,650,694 | A | * | 7/1997 | Jayaraman et al. ........... 315/225 |
| 5,740,026 | A | * | 4/1998 | Karol .............................. 363/86 |
| 6,163,470 | A | * | 12/2000 | Chavez et al. ................... 363/53 |
| 6,642,672 | B2 | * | 11/2003 | Hu et al. ........................ 315/276 |
| 6,735,097 | B1 | * | 5/2004 | Prasad et al. .................... 363/44 |
| 6,952,142 | B2 | * | 10/2005 | Guitton ................. H03H 7/422 333/177 |

(Continued)

FOREIGN PATENT DOCUMENTS

| JP | 2006-013713 A | 1/2006 |
| JP | 2008-227019 A | 9/2008 |
| KR | 10-2003-0026977 A | 4/2003 |

OTHER PUBLICATIONS

KIPO Office Action for Korean Patent Application No. 10-2012-0117328 which corresponds to the above-identified U.S. Application.

*Primary Examiner* — Adolf Berhane
(74) *Attorney, Agent, or Firm* — LRK Patent Law Firm

(57) ABSTRACT

A common mode filter and a power supply device having the same are provided. The common mode filter includes a first inductor having a first winding number, a second inductor facing the first inductor and having a second winding number, a first intermediate terminal branching from an intermediate portion of a coil of the first inductor, and a second intermediate terminal branching from an intermediate portion of a coil of the second inductor. The effects of two filters are obtained from one common mode filter and the volume is reduced, so that a light, thin, short, and short module is provided.

14 Claims, 3 Drawing Sheets

(56) References Cited

U.S. PATENT DOCUMENTS

| | | | |
|---|---|---|---|
| 7,088,596 B2 * | 8/2006 | Yamashita et al. | 363/20 |
| 7,348,862 B1 * | 3/2008 | Norte | 333/12 |
| 7,813,501 B2 * | 10/2010 | Thomson | H04L 12/10 333/177 |
| 8,284,007 B1 * | 10/2012 | Langner | H01F 19/04 324/117 R |
| 9,013,900 B2 * | 4/2015 | Kondo | 363/39 |
| 2014/0306781 A1 * | 10/2014 | Zhang | H03H 7/427 333/177 |

* cited by examiner

COMMON MODE FILTER AND POWER SUPPLY DEVICE HAVING THE SAME

BACKGROUND

The disclosure relates to a common mode filter and a power supply device having the same.

Large-scale electronic appliances include main functional modules. For example, TVs include backlight modules and display modules.

The large-scale electronic appliances include power supply devices to supply power to the module.

The power supply device receives AC input power, converts the AC input power into reference power for each module, and supplies the reference power to the module.

The power supply device employs a filter to cut off the interference of an electromagnetic field.

The filter employs a common mode filter. In general, the common mode filter passes differential mode current and cuts off common mode current. In other words, the common mode filter includes at least two filters to remove the interference of the electromagnetic field.

However, recently, as an ultra-slim and light circuit design is required in the large-scale electronic appliance such as a TV, the number of parts is decreased. Therefore, there occur problems when using a plurality of common mode filters occupying a large volume.

SUMMARY

The embodiment provides a power supply device capable of obtaining a plurality of outputs by using one common mode filter.

According to the embodiment, there is provided a common mode filter including a first inductor having a first winding number, a second inductor facing the first inductor and having a second winding number, a first intermediate terminal branching from an intermediate portion of a coil of the first inductor, and a second intermediate terminal branching from an intermediate portion of a coil of the second inductor.

According to the embodiment, there is provided a power supply device including a filter unit comprising a common mode filter to receive AC power to remove a common mode noise, a transformer unit receiving an output of the filter unit to generate DC power, and an output unit outputting the DC power of the transformer unit to an outside. The common mode filter includes a first inductor having a first winding number, a second inductor facing the first inductor and having a second winding number, a first intermediate terminal branching from an intermediate portion of a coil of the first inductor, and a second intermediate terminal branching from an intermediate portion of a coil of the second inductor.

As described above, according to the embodiment, the effects of two filters can be obtained from one common mode filter, so that a light, thin, short, and short module can be provided.

In addition, efficiency can be improved in spite of a device having the same volume as that of the related art, so that the manufacturing cost can be reduced.

DETAILED DESCRIPTION OF THE EMBODIMENTS

Hereinafter, embodiments will be described in detail with reference to accompanying drawings so that those skilled in the art can easily work with the embodiments. However, the embodiments may not be limited to those described below, but have various modifications.

In the following description, when a predetermined part "includes" a predetermined component, the predetermined part does not exclude other components, but may further include other components unless otherwise indicated.

Hereinafter, a power supply device according to the embodiment will be described with reference to FIGS. 1 to 3.

Figure 1:
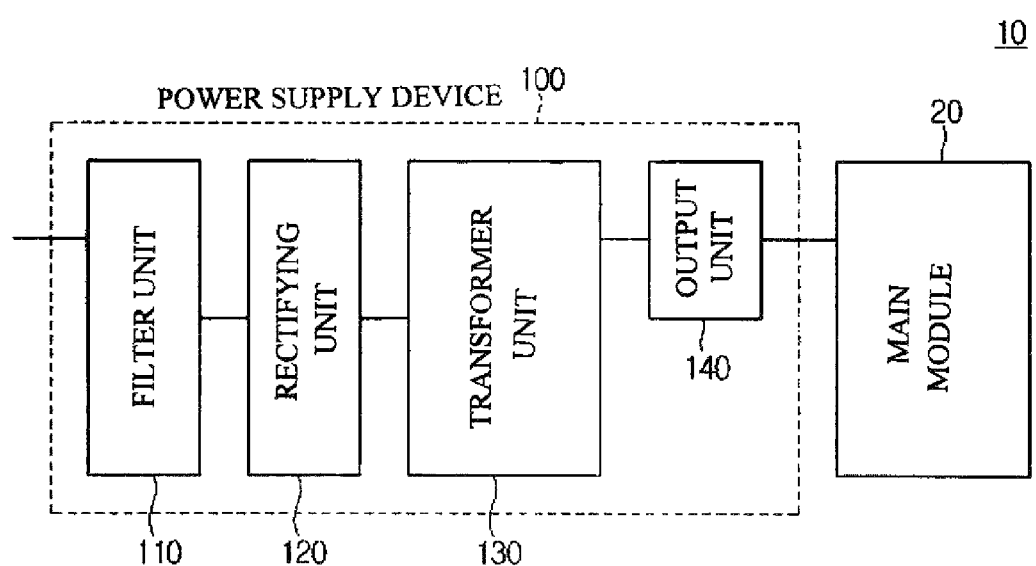
FIG. 1 is a block diagram showing an electronic appliance including a power supply device according to the present invention.
Figure 2A:
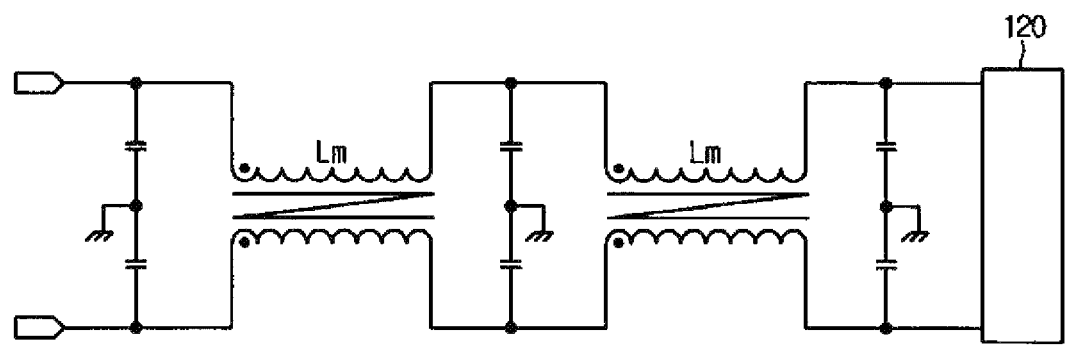
FIGS. 2A and 2B are circuit diagrams showing a filter unit.
Figure 2B:
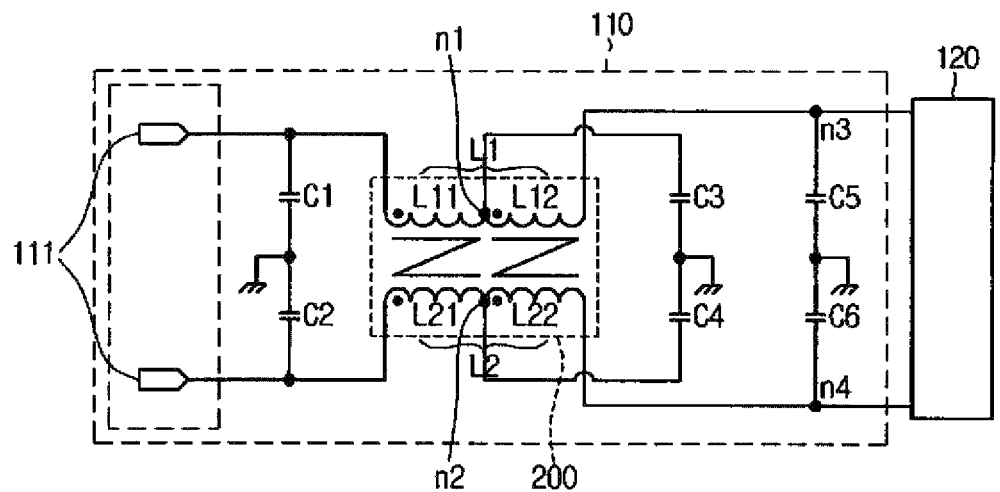
Figure 3A:
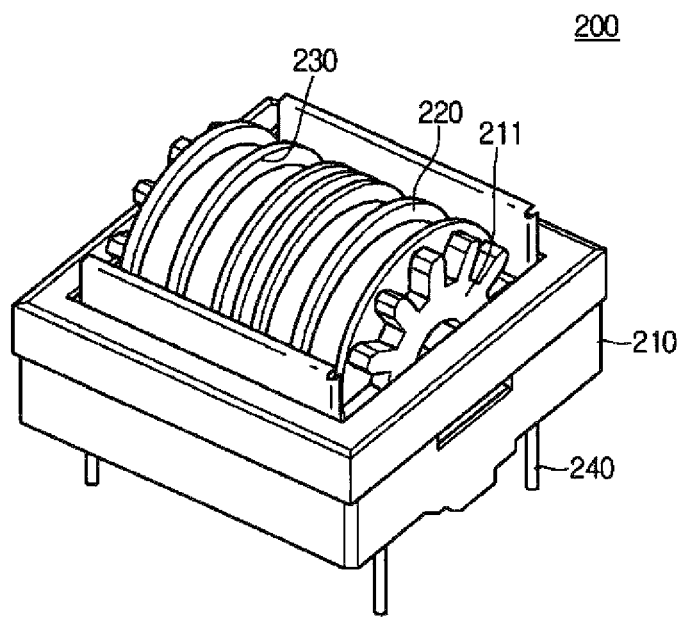
FIGS. 3A and 3B are views showing inductor structures of FIG. 2.
Figure 3B:
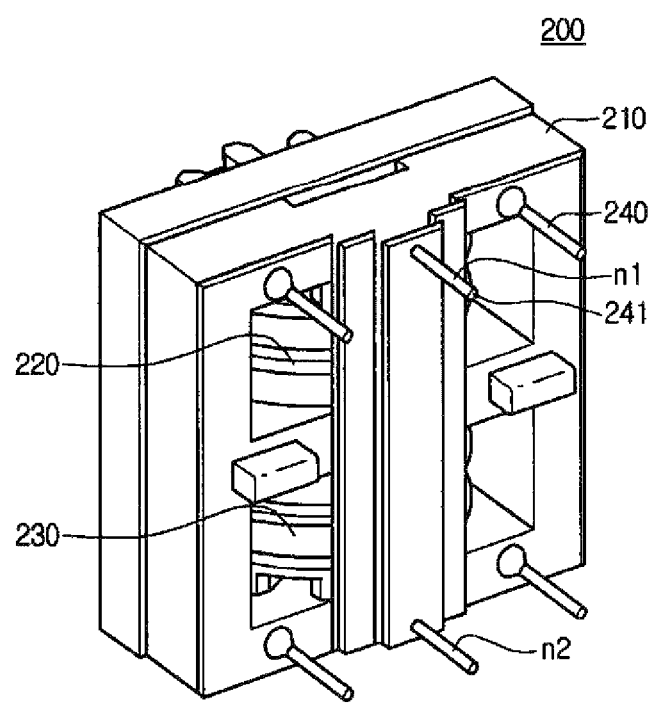

FIG. 1 is a block diagram showing an electronic appliance including a power supply device according to the present invention. FIGS. 2A and 2B are circuit diagrams showing a filter unit. FIGS. 3A and 3B are views showing inductor structures of FIG. 2.

Referring to FIG. 1, an electronic appliance 10 according to the present invention includes a power supply device 100 and a main module 20.

The electronic appliance 10 includes at least one main module 20.

If the electronic appliance 10 is a TV, the main module 20 may include a display module, a backlight module, or a communication module.

The power supply device 100 receives external AC input power, generates reference power to drive each module, and supplies the reference module to the module.

If different reference powers are required according to modules, the power supply device 100 may generate reference powers different from each other and output the reference power.

The power supply device 100 includes a filter unit 110, a rectifying unit 120, a transformer unit 130, and an output unit 140.

The filter unit 110 removes electro-magnetic interference (EMI) inflowing therein along an input AC signal and outputs the input AC signal to the rectifying unit 120.

The rectifying unit 120 receives an output AC signal from the filter unit 110, converts the AC signal into a DC signal, and outputs the DC signal to the transformer unit 130.

The rectifying unit 120 may include a bridge rectifier.

The transformer unit 130 transforms the DC signal converted by the rectifying unit 120 into a signal having a predetermined size and transmits the signal to the output unit 140.

The output unit 140 transmits power through a wireless scheme or a wired scheme and supplies the reference voltage to the main module 20.

The transformer unit 130 may include a switch mode power supply (SMPS) including a transformer and a switching device, but the embodiment is not limited thereto.

Further, in the power supply device 100, the transformer unit 130 may include a control unit (not shown) to control an on/off operation of a switching device. When the transformer unit 130 includes a control unit, the control unit includes a power factor correction circuit to control the on/off operation of the switching device.

Hereinafter, the filter unit will be described with reference to FIGS. 2 and 3.

FIG. 2A shows a typical filter unit, FIG. 2B shows a filter unit according to the present invention, FIG. 3A shows the top surface of an inductor structure of the filter unit, and FIG. 3B shows the bottom surface of the inductor structure.

Referring to FIG. 2B, the filter unit 110 includes an input terminal 111 to receive AC power, a common mode filter 200 to remove a common mode component of the AC power received from the input terminal 111, and a plurality of capacitors C1 to C6.

The input terminal 111 may include a first input terminal to transmit an AC input signal and a second input terminal to transmit a neutral signal for the one input terminal 111.

The AC input signal may include a differential signal having a phase difference of 180°. The filter unit 110 filters a common mode signal of the differential signals and outputs the common mode signal to the outside.

The common mode filter 200 includes two inductors L1 and L2 facing each other.

The first inductor L1 is connected between the first input terminal and a first output, terminal n3 and has a first winding number.

The first inductor L2 has an intermediate terminal n1 positioned at a portion of the first winding number.

The first inductor L1 has a first sub-inductor L11 and a second sub-inductor L12 separated from each other by the intermediate terminal n1.

Although the first sub-inductor L11 has the same winding number as that of the second sub-inductor L12, the first sub-inductor L11 may have a first sub-winding number, and the second sub-inductor L12 may have a second sub-winding number.

In other words, the first sub-winding number of the first sub-inductor L11 may be different from the second sub-winding number of the second sub-inductor L12.

In this case, according to the embodiment, the first and second winding numbers may be determined based on a filtering characteristic required according to the characteristics of input power. As described above, the first winding number of the first sub-inductor L11 is different from the second winding number of the second sub-inductor L12, so that the optimal filtering effect according to the user environment can be provided.

The second inductor L2 faces the first inductor L1. The second inductor L2 is connected between the second input terminal and the second output terminal n4 and has a second winding number.

The second inductor L2 is connected at a position having a portion of the second winding number and has an intermediate terminal n2 exposed to the outside.

The second inductor L2 has a first sub-inductor L21 and a second sub-inductor L22 separated from each other by the intermediate terminal n2.

Although the first sub-inductor L21 has the same winding number as that of the second sub-inductor L22, the first sub-inductor L21 may have a first sub-winding number, and the second sub-inductor L22 may have a second sub-winding number.

In other words, similarly to the description of the first inductor L1, the first sub-winding number of the first sub-inductor L21 may be different from the second sub-winding number of the second sub-inductor L22.

In this case, the first sub-inductor L11 of the first inductor L1 and the first sub-inductor L21 of the second inductor L2, which face each other, have the same first sub-winding number, and the second sub-inductor L12 of the first inductor L1 and the second sub-inductor L22 of the second, inductor L2 which face each other have the same second sub-winding number.

The first capacitor C1 is formed between the first input terminal and the ground, and the second capacitor C2 is formed between the second input terminal and the ground.

The first and second capacitors C1 and C2 include Y capacitors to remove the common mode noise.

In addition, the third capacitor C3 is formed between the first intermediate terminal n1 and the ground, and the fourth capacitor C4 is formed between the second intermediate terminal n2 and the ground.

The third and fourth capacitors C3 and C4 include Y capacitors to remove common mode noise.

In addition, the fifth capacitor C5 is formed between the first output terminal n3 and the ground, and the sixth capacitor C6 is formed between the second output terminal n4 and the ground.

The fifth and sixth capacitors C5 and C6 include Y capacitors to remove the common mode noise.

The filter unit 110 configured as described above removes the common mode noise through the capacitors C1 to C6, and removes current, which rapidly flows due to the magnetic induction, through the common mode filter 200, thereby removing electromagnetic noise, so that only the differential signal is output to the output terminals n3 and n4.

The above filter unit 110 may have the same effect as that of the related art in which two common mode filters Lm having the same size are realized as shown in FIG. 2A, and Y capacitors are formed at front and rear terminals of each filter Lm as shown in FIG. 2B.

In other words, while one common mode filter 200 is provided, portions of winding wires are exposed to the outside at intermediate portions of an inductor to form terminals n1 and n2, so that a filtering process is performed twice. Accordingly, the embodiment may have the same effect as those of a plurality of common mode filters.

Hereinafter, an inductor structure in which the common mode filter 200 is realized will be described with reference to FIGS. 3A and 3B.

FIG. 3A is a perspective view showing the structure of an inductor L when viewed from the top, and FIG. 3B is a perspective view showing the inductor structure when viewed from the bottom.

The inductor structure according to the embodiment includes two cores 211 separated from each other in a house 210, and includes coils 220 and 230 wound around the cores 211, respectively.

The coils 220 and 230 wound around the cores 211 constitute inductors, respectively, and the two inductors are inserted into one house 210 to realize the common mode filter 200.

In the common mode filter 200, distal ends of the coils 220 and 230 are exposed to the bottom surface of the house 210 to form terminals 240.

In this case, in the common mode filter 200 according to the embodiment, the coils 220 and 230 are cut at the intermediate portions thereof and the intermediate portions are exposed to the outside, thereby forming the intermediate terminals 241.

As described above, the intermediate terminals 241 are formed at the intermediate portions of the coils 220 and 230, so that the structural change from a common mode filter of the related art can be minimized while the filtering effects twice greater than that of the related art can be obtained. Accordingly, the volume of the device can be reduced and the cost can be saved.

Although a preferred embodiment of the disclosure has been described for illustrative purposes, those skilled in the art will appreciate that various modifications, additions and substitutions are possible, without departing from the scope and spirit of the invention as disclosed in the accompanying claims.

What is claimed is:
1. A common mode filter comprising:
a first inductor having a first winding number, wherein the first inductor comprises a first input terminal of a first coil of the first inductor, a first output terminal of the first coil, and a first intermediate terminal branching from an intermediate portion between the first input terminal and the first output terminal;

a second inductor facing the first inductor and having a second winding number, wherein the second inductor comprises a second input terminal of a second coil of the second inductor, a second output terminal of the second coil, and a second intermediate terminal branching from an intermediate portion between the second input terminal and the second output terminal;

a first capacitor having one end connected to the first intermediate terminal, and another end connected to a ground;

a second capacitor having one end connected to the second intermediate terminal, and another end connected to the other end of the first capacitor and the ground;

a third capacitor having one end connected to the first output terminal, and another end connected to the ground; and a fourth capacitor having one end connected to the second output terminal, and another end connected to the other end of the third capacitor and the ground.

2. The common mode filter of claim 1, wherein the first inductor comprises:

a first sub-inductor defined by the first coil between the first input terminal and the first intermediate terminal; and a second sub-inductor defined by the first coil between the first intermediate terminal and the first output terminal, and wherein the second inductor comprises:

a first sub-inductor defined by the second coil between the second input terminal and the second intermediate terminal; and a second sub-inductor defined by the second coil between the second intermediate terminal and the second output terminal.

3. The common mode filter of claim 2, wherein:

the first sub-inductor of the first inductor has a winding number equal to a winding number of the first sub-inductor of the second inductor, and the second sub-inductor of the first inductor has a winding number equal to a winding number of the second sub-inductor of the second inductor.

4. The common mode filter of claim 3, wherein:

the first sub-inductor of the first inductor has the winding number different from the winding number of the second sub-inductor of the first inductor, and the first sub-inductor of the second inductor has the winding number different from the winding number of the second sub-inductor of the second inductor.

5. The common mode filter of claim 3, further comprising a housing to receive both of the first and second inductors.

6. A power supply device comprising:

a filter unit comprising a common mode filter to receive AC power to remove a common mode noise;

a transformer unit receiving an output of the filter unit to generate DC power; and an output unit outputting the DC power of the transformer unit to an outside, wherein the common mode filter comprises:

a first inductor having a first winding number, wherein the first inductor comprises a first input terminal of a first coil of the first inductor, a first output terminal of the first coil, and a first intermediate terminal branching from an intermediate portion between the first input terminal and the first output terminal;

a second inductor facing the first inductor and having a second winding number, wherein the second inductor comprises a second input terminal of a second coil of the second inductor, a second output terminal of the second coil, and a second intermediate terminal branching from an intermediate portion between the second input terminal and the second output terminal;

a first capacitor having one end connected to the first intermediate terminal, and another end connected to a ground;

a second capacitor having one end connected to the second intermediate terminal, and another end connected to the other end of the first capacitor and the ground;

a third capacitor having one end connected to the first output terminal, and another end connected to the ground; and a fourth capacitor having one end connected to the second output terminal, and another end connected to the other end of the third capacitor and the ground.

7. The power supply device of claim 6, wherein the first inductor comprises:

a first sub-inductor defined by the first coil between the first input terminal and the first intermediate terminal; and a second sub-inductor defined by the first coil between the first intermediate terminal and the first output terminal, and wherein the second inductor comprises:

a first sub-inductor defined by the second coil between the second input terminal and the second intermediate terminal; and a second sub-inductor defined by the second coil between the second intermediate terminal and the second output terminal.

8. The power supply device of claim 7, wherein:

the first sub-inductor of the first inductor has a winding number equal to a winding number of the first sub-inductor of the second inductor, and the second sub-inductor of the first inductor has a winding number equal to a winding number of the second sub-inductor of the second inductor.

9. The power supply device of claim 8, wherein:

the first sub-inductor of the first inductor has the winding number different from the winding number of the second sub-inductor of the first inductor, and the first sub-inductor of the second inductor has the winding number different from the winding number of the second sub-inductor of the second inductor.

10. The power supply device of claim 7, wherein the first to fourth capacitors comprise Y capacitors.

11. The power supply device of claim 6, wherein the common mode filter further comprises a housing to receive both of the first and second inductors.

12. The power supply device of claim 6, further comprising a rectifying unit disposed between the filter unit and the transformer unit to rectify the filtered AC power.

13. The power supply device of claim 1, wherein the AC power comprises a differential signal having a phase difference of 180°.

14. The power supply device of claim 1, wherein the transformer unit comprises an SMPS (Switch Mode Power Supply).

* * * * *